US010186563B2

(12) United States Patent
Jin et al.

(10) Patent No.: US 10,186,563 B2
(45) Date of Patent: Jan. 22, 2019

(54) ORGANIC LIGHT EMITTING DIODE DISPLAY DEVICE AND METHOD OF MANUFACTURING THE SAME

(71) Applicant: Samsung Display Co., Ltd., Yongin-si, Gyeonggi-do (KR)

(72) Inventors: Seong-Hyun Jin, Yongin-si (KR); Jae-Hwan Oh, Yongin-si (KR); Yeoung-Jin Chang, Yongin-si (KR); Se-Hun Park, Yongin-si (KR); Won-Kyu Lee, Yongin-si (KR); Jae-Beom Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/859,102

(22) Filed: Dec. 29, 2017

(65) Prior Publication Data

US 2018/0122879 A1    May 3, 2018

Related U.S. Application Data

(62) Division of application No. 14/012,988, filed on Aug. 28, 2013, now Pat. No. 9,859,347.

(30) Foreign Application Priority Data

Dec. 5, 2012 (KR) .................. 10-2012-0140542

(51) Int. Cl.
*H01L 27/32* (2006.01)
*H01L 51/52* (2006.01)

(52) U.S. Cl.
CPC ...... *H01L 27/3248* (2013.01); *H01L 27/3246* (2013.01); *H01L 51/5209* (2013.01); *H01L 51/5215* (2013.01); *H01L 51/5265* (2013.01)

(58) Field of Classification Search
CPC ............. H01L 51/5209; H01L 51/5265; H01L 51/5268
See application file for complete search history.

(56) References Cited

U.S. PATENT DOCUMENTS 6,441,873 B2   8/2002   Young
6,977,698 B2   12/2005  Ikeno et al.
(Continued)

FOREIGN PATENT DOCUMENTS

JP   3642048 B2       2/2005
JP   2010-186613 A    8/2010
(Continued)

OTHER PUBLICATIONS

Quintana, P., et al. Thickness effects on aluminum thin films. Superficies y Vacío 9 (1999) 280-282.*
(Continued)

*Primary Examiner* — Thao X Le
*Assistant Examiner* — Gardner W Swan
(74) *Attorney, Agent, or Firm* — Lewis Roca Rothgerber Christie LLP

(57) ABSTRACT

An organic light emitting diode (OLED) display device and a method of manufacturing the same. The device includes a substrate, a thin film transistor (TFT) on the substrate and including an active layer, a gate electrode, a source electrode, and a drain electrode, a first pixel electrode coupled to one of the source and drain electrodes, a rough portion on the first pixel electrode, a second pixel electrode on the rough portion and having a rough pattern, an intermediate layer on the second pixel electrode including an organic emission layer (EML), and an opposing electrode on the intermediate layer.

6 Claims, 5 Drawing Sheets

(56) References Cited

U.S. PATENT DOCUMENTS

| | | |
|---|---|---|
| 7,006,179 B2 | 2/2006 | Kim |
| 8,354,669 B2 | 1/2013 | No et al. |
| 2001/0005245 A1 | 6/2001 | Sakamoto et al. |
| 2001/0038429 A1 | 11/2001 | Baek et al. |
| 2003/0193638 A1 | 10/2003 | Masutani et al. |
| 2005/0263761 A1 | 12/2005 | Kim et al. |
| 2005/0285509 A1 | 12/2005 | Funamoto et al. |
| 2006/0238111 A1 | 10/2006 | Shimizu et al. |
| 2007/0092981 A1* | 4/2007 | Jung .................. H01L 51/5088 438/30 |
| 2009/0115326 A1* | 5/2009 | Chan .................. H01L 51/5265 313/504 |
| 2009/0206733 A1 | 8/2009 | Hwang et al. |
| 2009/0278131 A1 | 11/2009 | Kwon et al. |
| 2009/0302332 A1 | 12/2009 | Kang et al. |
| 2010/0133994 A1 | 6/2010 | Song et al. |
| 2011/0175073 A1 | 7/2011 | Chang |
| 2011/0205468 A1 | 8/2011 | Hirakata et al. |
| 2011/0241029 A1 | 10/2011 | An |
| 2012/0001182 A1 | 1/2012 | Choi et al. |
| 2013/0001603 A1 | 1/2013 | Lim et al. |
| 2013/0146875 A1 | 6/2013 | Mandlik et al. |

FOREIGN PATENT DOCUMENTS

| | | |
|---|---|---|
| KR | 2003-0058228 | 7/2003 |
| KR | 10-2009-0089151 | 8/2009 |
| KR | 10-2011-0126379 | 11/2011 |
| KR | 10-2012-0003166 | 1/2012 |

OTHER PUBLICATIONS

Patent Abstracts of Japan for Publication No. 2003-183478; dated Jul. 3, 2003 in the name of Minowa, et al., which corresponds to JP 3642048 B2, 1 page.

\* cited by examiner

US 10,186,563 B2

ORGANIC LIGHT EMITTING DIODE DISPLAY DEVICE AND METHOD OF MANUFACTURING THE SAME

CROSS-REFERENCE TO RELATED PATENT APPLICATION

This application is a divisional of U.S. patent application Ser. No. 14/012,988, filed Aug. 28, 2013, which claims priority to and the benefit of Korean Patent Application No. 10-2012-0140542, filed Dec. 5, 2012, the entire content of both of which is incorporated herein by reference.

BACKGROUND

1. Field

Aspects of the present invention relate to an organic light emitting diode (OLED) display device and a method of manufacturing the same.

2. Description of the Related Art

Flat panel displays (FPDs), such as organic light emitting diode (OLED) display devices and liquid crystal display (LCD) devices, may include a thin film transistor (TFT), a capacitor, and a line configured to connect the TFT and the capacitor.

An OLED display device has attracted attention as an advanced display device because the OLED display device may be driven at a relatively low voltage, may be made relatively lightweight and ultra-thin, and may have a relatively wide viewing angle, a high contrast ratio, and a high response speed.

Because the OLED display device has a wide emission wavelength band, the luminous efficiency and color purity of the OLED display device may become degraded. Also, because light emitted by an organic emission layer does not have a specific directionality, a large number of photons emitted in an arbitrary direction may not reach an actual observer due to internal total reflection of an OLED, thereby lowering light extraction efficiency of the OLED. To improve the light extraction efficiency, a distributed Bragg reflector (DBR) mirror may be included in the OLED display device, or a resonance structure capable of controlling the thickness of an organic layer may be applied. However, although the resonance structure may improve optical efficiency, color shift relative to a viewing angle may occur.

SUMMARY

Embodiments of the present invention provide an organic light emitting diode (OLED) display device and a method of manufacturing the same, which may promote optical efficiency and improve color shift relative to a viewing angle.

In one embodiment according to the present invention, an OLED display device includes: a substrate, a thin film transistor (TFT) on the substrate and including an active layer, a gate electrode, a source electrode, and a drain electrode, a first pixel electrode coupled to one of the source and drain electrodes, a rough portion on the first pixel electrode, a second pixel electrode on the rough portion and having a rough pattern, an intermediate layer on the second pixel electrode and including an organic emission layer (EML), and an opposing electrode on the intermediate layer.

The first pixel electrode may include a transparent conductive material.

The first pixel electrode may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second pixel electrode may include a transflective metal layer.

The transflective metal layer may include silver (Ag) or an Ag alloy.

The rough portion and an insulating layer covering the TFT may comprise a same material.

The OLED display device may further include an opening exposing the first pixel electrode in the insulating layer, and the rough portion may be within the opening.

The insulating layer may include an organic insulating material.

The first pixel electrode may be in a same layer as the gate electrode and the first pixel electrode and the gate electrode may include a same material.

The OLED display device may further include a capacitor first electrode in the same layer as the active layer, and a capacitor second electrode in the same layer as the first pixel electrode.

The capacitor first electrode may include a doped semiconductor.

The rough portion and an insulating layer covering the TFT may include a same material as that of an insulating layer covering the TFT, and a top surface of the capacitor second electrode may be in direct contact with an insulating layer forming the rough portion.

The second pixel electrode may be electrically coupled to one of the source or drain electrodes.

The insulating layer may be between the first pixel electrode and the opposing electrode.

The insulating layer may have an opening exposing the first pixel electrode, and the rough portion may be in the opening.

The insulating layer may include an organic material.

The first pixel electrode may be at a same layer as the gate electrode, and the first pixel electrode and the gate electrode may comprise a same material.

A capacitor first electrode may be at a same layer as the active layer, and a capacitor second electrode may be at a same layer as the first pixel electrode.

The capacitor first electrode may include a doped semiconductor.

The rough portion and an insulating layer covering the TFT may include a same material and a top surface of the capacitor second electrode may be in direct contact with the rough portion.

The first and second pixel electrodes may be electrically coupled to one of the source and drain electrodes in opposite directions.

The second pixel electrode may be electrically coupled to one of the source and drain electrodes.

An insulating layer may be between the first pixel electrode and the opposing electrode, an opening exposing the first pixel electrode may be in the insulating layer, the rough portion may be in the opening, and the second pixel electrode may extend along an etched surface of the opening in the insulating layer and may be on the rough portion.

A buffer layer may be between the substrate and the first pixel electrode.

In another embodiment according to the present invention, there is provided a method of manufacturing an OLED display device. The method includes forming a TFT including an active layer, a gate electrode, a source electrode, and a drain electrode on a substrate, forming a first pixel electrode on the substrate to be coupled to one of the source and drain electrodes, forming a rough portion on the first pixel electrode, forming a second pixel electrode on the rough portion, forming an intermediate layer including an organic EML on the second pixel electrode, and forming an opposing electrode on the intermediate layer.

The rough portion and an insulating layer formed between the first pixel electrode and the opposing electrode may include a same material.

The insulating layer may include an organic insulating material.

The first pixel electrode may be at a same layer as the gate electrode, an opening may be formed in the insulating layer to expose the first pixel electrode, and the rough portion may be within the opening.

The method may further include coupling the second pixel electrode to one of the source electrode and the drain electrode.

The method may further include forming a capacitor first electrode in the same layer as the active layer, and forming a capacitor second electrode at a same layer as the first pixel electrode.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
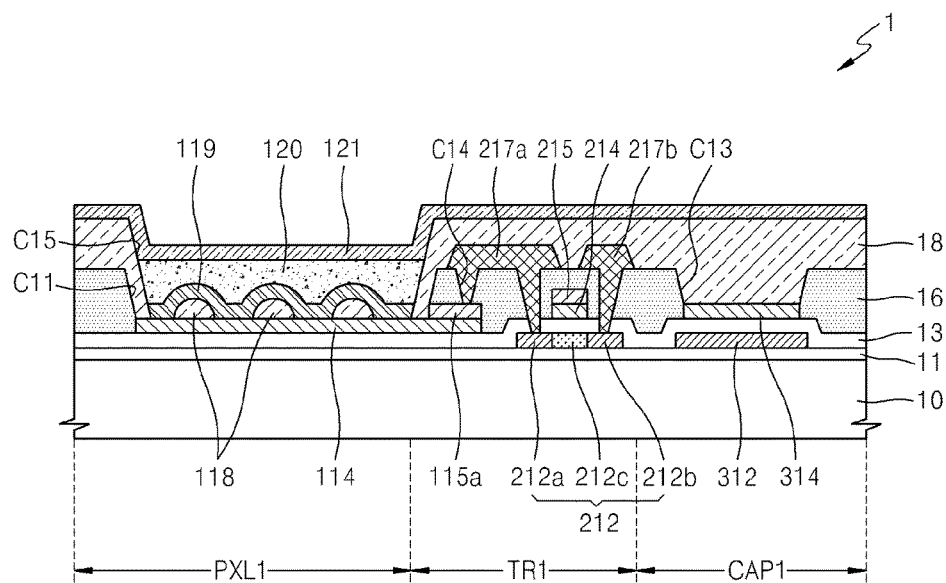
FIG. 1 is a cross-sectional view of an organic light emitting diode (OLED) display device according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the present invention to one of ordinary skill in the art.

Descriptions of irrelevant portions are omitted for clarity, and like numbers refer to like elements throughout.

In various embodiments, components having the same configurations will typically be described using the same reference numerals in a first embodiment, and different configurations than in the first embodiment will be chiefly described in other embodiments.

Sizes and thicknesses of respective elements shown in the drawings may be arbitrarily shown for clarity, and thus, the present invention is not limited thereto.

In the drawings, the thicknesses of layers and regions may be enlarged for clarity. Also, the thicknesses of some layers and regions may be exaggerated for clarity. It will also be understood that when a layer is referred to as being "on" another layer or substrate, it may be directly on the other layer or substrate or intervening layers may also be present.

It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

In the specification, the term "on" may encompass both an orientation of on and under. When a layer is referred to as being "on" another layer, it is not necessarily on the other layer in a gravitational direction.

FIG. 1 is a cross-sectional view of an organic light emitting diode (OLED) display device 1 according to an embodiment of the present invention.

Referring to FIG. 1, a pixel region PXL1, a transistor region TR1, and a capacitor region CAP1 may be formed on a substrate 10.

The substrate 10 may be a transparent substrate, for example, a glass substrate or a plastic substrate including polyethylene terephthalate (PET), polyethylene naphthalate (PET), or polyimide (PI).

A buffer layer 11 may be formed on the substrate 10. The buffer layer 11 may form a flat surface on the substrate 10 and prevent diffusion of impurity elements. The buffer layer 11 may include a single layer or a multi-layered structure formed of silicon nitride and/or silicon oxide.

In the transistor region TR1, an active layer 212 may be formed on the buffer layer 11. The active layer 212 may be formed of a semiconductor including amorphous silicon (a-Si) or crystalline silicon. The active layer 212 may include a channel region 212c and a source region 212b and drain region 212a, which may be doped with impurity ions outside the channel region 212c. The active layer 212 is not limited to a-Si or crystalline silicon and may include an oxide semiconductor.

A gate electrode 214 and 215 may be formed over the active layer 212 with a first insulating layer 13 serving as a gate insulating layer therebetween. The gate electrode 214 and 215 may be formed or located in a position corresponding to the channel region 212c of the active layer 212.

The gate electrode 214 and 215 may include a first layer 214 and a second layer 215 stacked sequentially. The first layer 214 may include a transparent conductive oxide, and the second layer 215 may include a metal having a lower resistance than the first layer 214.

The first layer 214 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second layer 215 may include a single layer or a multi-layered structure formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu).

A second insulating layer 16 serving as an interlayer insulating layer may be formed on the gate electrode 214 and 215. An opening C11 and an opening C13 may be formed in the second insulating layer 16. The opening C11 may expose a top surface of a first pixel electrode 114, and the opening C13 may expose a top surface of a capacitor second electrode 314 of the capacitor region CAP1.

A source electrode 217*b* and a drain electrode 217*a* may be formed on the second insulating layer 16. The source and drain electrodes 217*b* and 217*a* may be formed through the second insulating layer 16 and electrically coupled to the source and drain regions 212*b* and 212*a* of the active layer 212, respectively. The source and drain electrodes 217*b* and 217*a* may include a single layer or a multi-layered structure including at least one metal selected from the group consisting of Al, Pt, Pd, Ag, Mg, Au, Ni, Nd, Ir, Cr, Ni, Ca, Mo, Ti, W, and Cu.

A third insulating layer 18 may be formed on the second insulating layer 16 to cover the source electrode 217*b* and the drain region 217*a*. The third insulating layer 18 may include an organic insulating layer. The opening C15 may be formed in the third insulating layer 18 to extend through the third insulating layer 18 and expose a top surface of the first pixel electrode 114 of the pixel region PXL1.

The first pixel electrode 114 may be located in or within the opening C15 in the pixel region PXL1. The first pixel electrode 114 may be formed of the same transparent conductive material as the first layer 214 of the above-described gate electrode 214 and 215. That is, the first pixel electrode 114 may include a transparent conductive material. The first pixel electrode 114 may include at least one selected from the group consisting of ITO, IZO, ZnO, $In_2O_3$, IGO, and AZO.

The first pixel electrode 114 may be electrically coupled to one of the source and drain electrodes 217*b* and 217*a*. Although FIG. 1 shows an example in which the first pixel electrode 114 is coupled to the drain electrode 217*a*, the present invention is not limited thereto, and the first pixel electrode 114 may be coupled to the source electrode 217*b*.

In the present embodiment, the first pixel electrode 114 may be directly coupled to a first connection 115*a* formed at an edge of the first pixel electrode 114, and the first connection 115*a* may be coupled to the drain electrode 217*a* through an opening C14 formed in the second insulating layer 16. That is, a portion of the drain electrode 217*a* may extend through the second insulating layer 16 to electrically couple the drain electrode 217*a* to the first connection 115*a*. The first connection 115*a* may include the same metal having a low resistance as that of the second layer 215 of the above-described gate electrode 214 and 215.

A rough portion 118 may be formed on the first pixel electrode 114. The rough portion 118 may be formed of the same material as that of the third insulating layer 18. The rough portion 118 may be formed of an organic insulating layer. Naturally, the rough portion 118 may be formed to have various shapes, such as a circular shape, a triangular shape, or a pentagonal shape. That is, the rough portion 118 may be formed as a pattern or series of shapes arranged on the first pixel electrode 114 such that a contour along a surface of the rough portion 118 and a surface of the first pixel electrode 114 is non-planar to form a rough pattern.

A second pixel electrode 119 may be formed on the rough portion 118 along a rough pattern of the rough portion 118. The second pixel electrode 119 may include a transflective metal layer. The transflective metal layer may include silver (Ag) or an Ag alloy. The second pixel electrode 119 may be formed by appropriately controlling the thickness of the transflective metal layer to partially transmit or reflect light emitted by an organic emission layer (EML) 120 that will be described later. Accordingly, the second pixel electrode 119 may form a micro-cavity structure along with an opposing electrode 121, which is reflective electrode that will be described later, and improve the optical efficiency of a bottom-emitting OLED display device 1. Also, because the second pixel electrode 119 is formed on the rough portion 118 to have a small thickness, the rough pattern of the rough portion 118 may be transferred to the second pixel electrode 119 such that a surface of the second pixel electrode 119 opposite the first pixel electrode 114 is non-planar and includes a contour corresponding to the contour along the surface of the rough portion 118 and the surface of the first pixel electrode. The rough pattern may efficiently reduce the occurrence of color shift on side surfaces of the OLED display device 1.

An intermediate or middle layer including the organic EML 120 may be formed on the second pixel electrode 119.

The organic EML 120 may include an organic monomer or an organic polymer. When the organic EML 120 includes an organic monomer, the intermediate or middle layer may include a hole transport layer (HTL), a hole injection layer (HIL), an electron transport layer (ETL), and an electron injection layer (EIL) that are stacked. In addition, various other layers may be stacked in the intermediate or middle layer as needed. In this case, the organic monomer may be one of various organic materials, for example, copper phthalocyanine (CuPc), N'-Di(naphthalene-1-yl)-N, N'-diphenyl-benzidine (NPB), or tris-8-hydroxyquinoline aluminum (Alq3). Meanwhile, when the organic EML 120 includes an organic polymer, the intermediate or middle layer may include an HTL. The HTL may include poly-(3,4)-ethylene-dihydroxy thiophene (PEDOT) or polyaniline (PANI). In this case, the organic polymer may be one of organic polymers, such as poly-phenylenevinylene(PPV)-based organic polymers or polyfluorene-based organic polymers. The organic EML 120 may form a single unit pixel using sub-pixels configured to emit red, green, and blue light.

Although the foregoing embodiment pertains to an example in which the organic EML 120 is formed within the opening C15 and emission materials configured to emit light in different colors are formed in respective pixels, the present invention is not limited thereto. The organic EML 120 may be equally formed on the third insulating layer 18 irrespective of the positions of pixels. For example, the organic EML 120 may be formed by vertically stacking or mixing layers including emission materials configured to emit light red, green, and blue light. Naturally, a combination of different colors may be used if white light is to be emitted. Also, the OLED display device 1 may further include a color shift layer configured to convert the emitted white light into light of another color (e.g., a predetermined color), or may include a color filter.

Meanwhile, although the intermediate or middle layer is not specifically shown in FIG. 1, various layers included in the intermediate or middle layer except for the organic EML 120 may be equally formed on all the pixels or partially formed on only some of the pixels. Also, the intermediate or middle layer may be formed to have a different thickness on the respective pixels as needed. The intermediate or middle layer may be formed of organic materials. However, the intermediate or middle layer is not limited to the organic materials and may include inorganic materials.

The opposing electrode 121 may be formed on the organic EML 120. The opposing electrode 121 may be a common electrode. In the OLED display device 1 according to the present embodiment, the first pixel electrode 114 may be used as an anode, and the opposing electrode 121 may be used as a cathode. Conversely, the first pixel electrode 114 may be used as a cathode, and the opposing electrode 121 may be used as an anode.

The opposing electrode 121 may be a reflective electrode including a reflective material. The opposing electrode 121 may include at least one material selected from the group consisting of silver (Ag), aluminum (Al), magnesium (Mg), lithium (Li), calcium (Ca), lithium fluoride/calcium (LiF/Ca), and LiF/Al. Because the opposing electrode 121 includes the reflective electrode, light emitted by the organic EML 120 may be reflected by the opposing electrode 121, transmitted through the first pixel electrode 114 including the transparent conductive material, and emitted toward the substrate 10. In this case, because the second pixel electrode 119 including the transflective material is formed between the first pixel electrode 114 and the opposing electrode 121, a micro-cavity structure may be formed to increase optical efficiency. Furthermore, as described above, color shift may be reduced due to the rough portion 118 formed between the first pixel electrode 114 and the opposing electrode 121.

In the capacitor region CAP1, a capacitor first electrode 312 may be formed on the substrate 10. The capacitor first electrode 312 may be formed in the same layer as the active layer 212. For instance, the capacitor first electrode 312 may be formed of the same material (e.g., a doped semiconductor material) as the source and drain regions 212b and 212a of the active layer 212. The first insulating layer 13 may extend from the transistor region TR1 and be formed on the capacitor first electrode 312. The first insulating layer 13 may function as a capacitor dielectric layer.

A capacitor second electrode 314 may be formed on the first insulating layer 13 using the same material as the first layer 214 of the gate electrode 214 and 215.

The third insulating layer 18 may be formed on the capacitor second electrode 314. The third insulating layer 18 may extend from the transistor region TR1 and be directly coupled to the capacitor second electrode 314. Because the third insulating layer 18 including an organic insulating material having a low dielectric constant is interposed between the capacitor second electrode 314 and the opposing electrode 121 serving as the common electrode, parasitic capacitance between the capacitor second electrode 314 and the opposing electrode 121 serving as the common electrode may be reduced.

In the OLED display device 1 according to the present embodiment, the first pixel electrode 114 including the transparent conductive material and the second pixel electrode 119 including the transflective metal may form the micro-cavity structure along with the common electrode 121 serving as the reflective electrode, thus improving the optical efficiency of the OLED display device 1. Also, the rough portion 118 formed between the first and second pixel electrodes 114 and 119 may efficiently reduce the occurrence of color shift on the side surfaces of the OLED display device 1.

Hereinafter, a method of manufacturing the OLED display device 1 according to the present embodiment will be described with reference to FIGS. 2A through 2F.

Figure 2A:
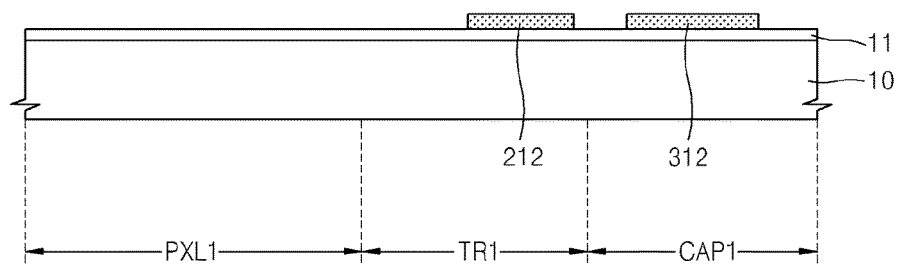
FIGS. 2A through 2F are cross-sectional views illustrating a method of manufacturing the OLED display device shown in FIG. 1.

FIG. 2A is a cross-sectional view of a resultant structure obtained by performing a first mask process on the OLED display device 1 of FIG. 1.

Referring to FIG. 2A, a buffer layer 11 and a semiconductor layer may be sequentially formed on a substrate 10, and the semiconductor layer may be patterned, thereby forming an active layer 212 of a TFT and a capacitor first electrode 312.

Although not shown in FIG. 2A, after the buffer layer 11 and the semiconductor layer are deposited on the substrate 10, a photoresist (not shown) may be coated on the semiconductor layer, and the semiconductor layer may be patterned using a photolithography process using a first photo mask (not shown). As a result, the active layer 212 and the capacitor first electrode 312 may be formed. The first mask process using the photolithography process may involve exposing the first photo mask using an exposure apparatus (not shown) and a series of processes, such as a developing process, an etching process, and a stripping process or an ashing process.

The semiconductor layer may include a-Si or polysilicon (poly-Si). In this case, the poly-Si may be formed by crystallizing the a-Si. The crystallization of the a-Si may be performed using various methods, such as a rapid thermal annealing (RTA) process, a solid-phase crystallization (SPC) process, an excimer laser annealing (ELA) process, a metal-induced crystallization (MIC) process, a metal-induced lateral crystallization (MILC) process, or a sequential lateral solidification (SLS) process. Meanwhile, the active layer 212 is not limited to a-Si or poly-Si and may include an oxide semiconductor.

Figure 2B:
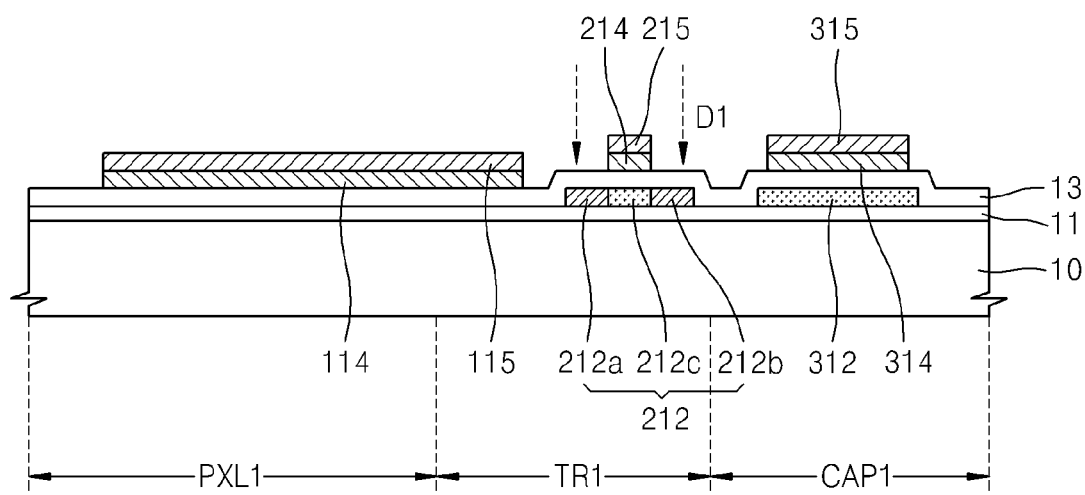

FIG. 2B is a cross-sectional view of a resultant structure obtained by performing a second mask process on the OLED display device 1 of FIG. 1.

Referring to FIG. 2B, a first insulating layer 13 may be formed on the resultant structure obtained using the first mask process of FIG. 2A, and a transparent conductive oxide (TCO) layer and a first metal layer may be sequentially stacked (e.g., layered, formed, positioned, or located) on the first insulating layer 13.

The first insulating layer 13 may include a single layer or multi-layered structure including at least one inorganic insulating layer selected from the group consisting of $SiO_2$, $SiN_x$, SiON, $Al_2O_3$, $TiO_2$, $Ta_2O_5$, $HfO_2$, $ZrO_2$, barium strontium titanate (BST), and lead zirconate titanate (PZT).

The TCO layer may include at least one selected from the group consisting of ITO, IZO, ZnO, $In_2O_3$, IGO, and AZO.

The first metal layer may include a single layer or multi-layered structure formed of at least one metal selected from the group consisting of Al, Pt, Pd, Ag, Mg, Au, Ni, Nd, Ir, Cr, Ni, Ca, Mo, Ti, W, and Cu.

The TCO layer and the first metal layer may be patterned so that the first pixel electrode 114 and a first pixel electrode upper layer 115 may be formed on the first insulating layer 13 in the pixel region PXL1, the gate electrode 214 and 215 may be formed in the transistor region TR1, and the capacitor second electrode 314 and a second electrode upper layer 315 may be formed in the capacitor region CAP1.

An ion doping process may be performed on the patterned structure. The ion doping process may include a first doping process D1 of doping boron(B) or phosphorus(P) ions at a concentration of about $1 \times 10^{15}$ atoms/cm$^2$ or higher into the active layer 212 of the TFT as a target. In this case, because the impurity ions are doped into the active layer 212 using the gate electrode 214 and 215 as a self-alignment mask, doped regions, that is, the drain region 212a, the source region 212b, and the channel region 212c interposed between the drain and source regions 212a and 212b, may be formed in the active region 212.

Although not shown in the drawings, a line coupled to the capacitor first electrode 312 formed of the same material in the same layer as the active layer 212 may be doped at the same time as the active layer 212. In this case, because the second electrode upper layer 315 functions as a blocking mask, the capacitor first electrode 312 may not be doped.

Figure 2C:
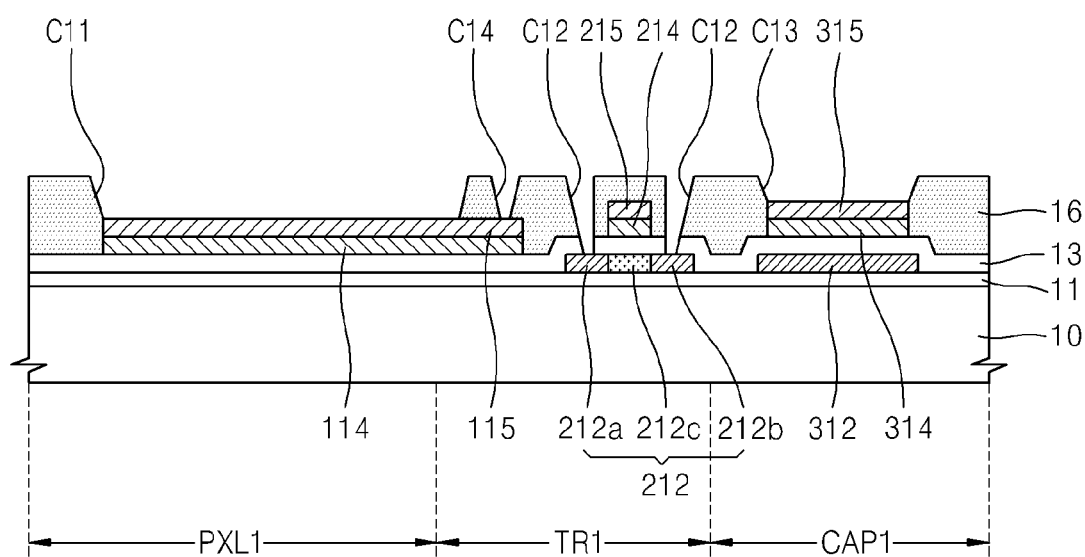

FIG. 2C is a cross-sectional view of a resultant structure obtained by performing a third mask process on the OLED display device 1 of FIG. 1.

Referring to FIG. 2C, a second insulating layer 16 may be formed on the resultant structure obtained using the second mask process of FIG. 2B, and then patterned.

Openings C11 and C14 may be formed in the pixel region PXL1 to expose portions of a surface of the first pixel electrode upper layer 115, while the second insulating layer 16 maintains coverage over a portion of the first pixel electrode upper layer 115 between openings C11 and C14. Openings C12 may be formed in the transistor region TR1 to expose portions of the source and drain regions 212b and 212a of the active layer 212. Also, an opening C13 may be formed in the capacitor region CAP1 to expose a surface of the second electrode upper layer 315 opposite the first insulating layer 13.

Figure 2D:
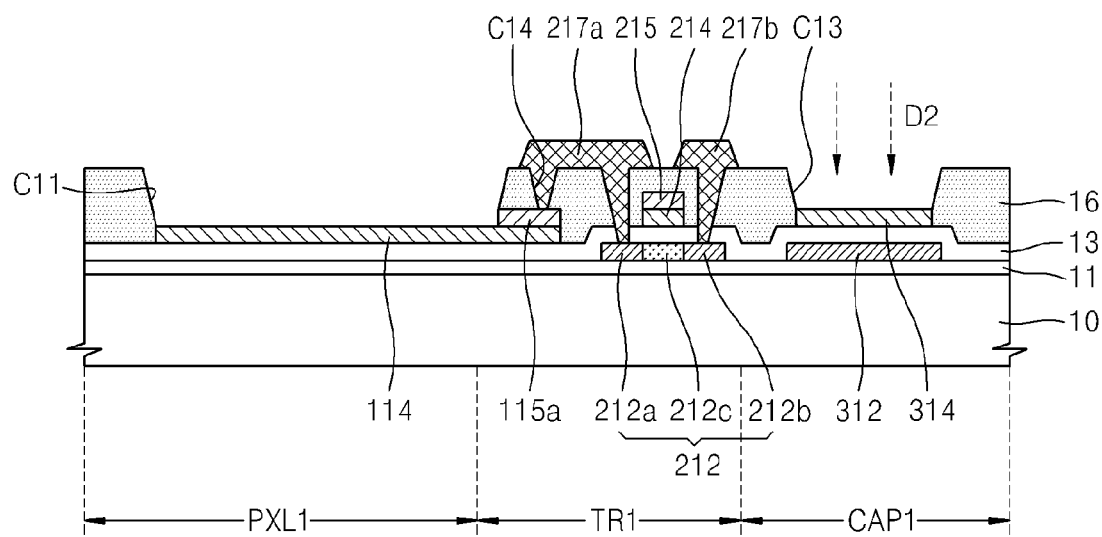

FIG. 2D is a cross-sectional view of a resultant structure obtained by performing a fourth mask process on the OLED display device 1 of FIG. 1.

Referring to FIG. 2D, a second metal layer may be formed on the resultant structure obtained using the third mask process of FIG. 2C.

The second metal layer may include a single layer or multi-layered structure formed of at least one metal selected from the group consisting of Al, Pt, Pd, Ag, Mg, Au, Ni, Nd, Ir, Cr, Ni, Ca, Mo, Ti, W and Cu. The second metal layer may be formed of the same material as the first metal layer.

The second metal layer may be patterned to form source and drain electrodes 217b and 217a, respectively. A first portion of the drain electrode 217a extends through the opening C14 formed through the insulating layer 16 to electrically couple the drain electrode 217a to the first pixel electrode upper layer 115 and the first pixel electrode 114. A second portion of the drain electrode 217a extends through one of the openings C12 formed through the insulating layer 16 to electrically couple the drain electrode 217a to the drain region 212a of the active layer 212. A portion of the source electrode 217b extends through one of the openings C12 formed through the insulating layer 16 to electrically couple the source electrode 217b to the source region 212b of the active layer 212.

During the formation of the source and drain electrodes 217b and 217a, the first pixel electrode upper layer 115 and the second electrode upper layer 315 may be simultaneously etched. In this case, the drain electrode 217a may be coupled to the first connection 115a, which is left under the second insulating layer 16 by etching the first pixel electrode upper layer 115, through the opening C14.

After etching the second electrode upper layer 315, a second doping process D2 may be performed on the capacitor first electrode 312 as a target. In this case, the capacitor second electrode 314 may be formed to an overall thickness in a range of about 100 Å to about 1000 Å. Because a metal-insulator-metal (MIM) capacitor structure is formed by doping the capacitor first electrode 312, capacitance may be maximized or increased, and a voltage margin may increase.

Figure 2E:
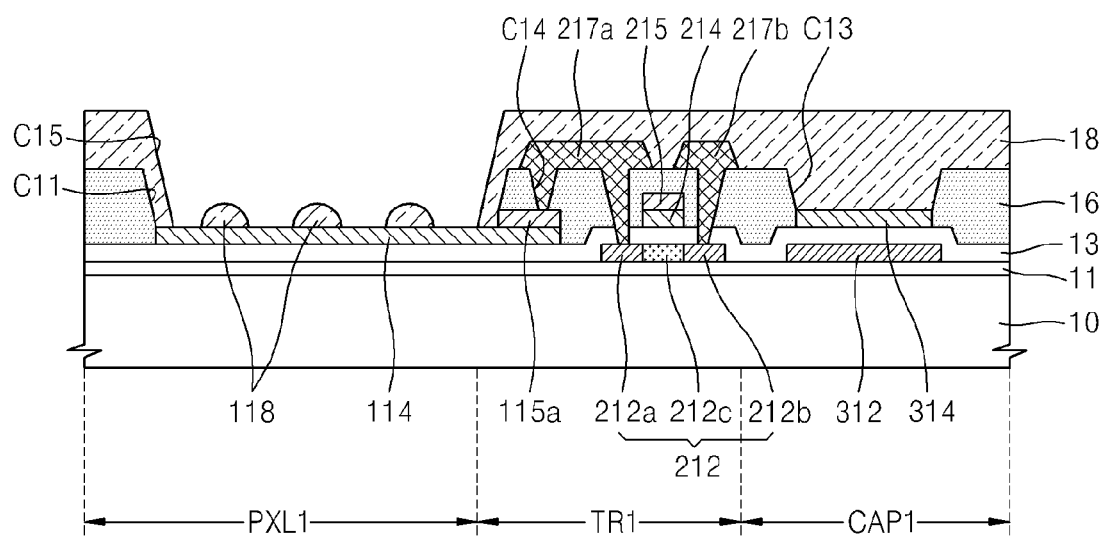

FIG. 2E is a cross-sectional view of a resultant structure obtained by performing a fifth mask process on the OLED display device of FIG. 1.

Referring to FIG. 2E, a third insulating layer 18 may be formed on the resultant structure obtained using the fourth mask process of FIG. 2D, and then patterned.

The third insulating layer 18 may cover the TFT of the transistor region TR1 and the capacitor region CAP1 and function as a planarization layer, and an opening C15 may be formed in the pixel region PXL1 to expose a top surface of the first pixel electrode 114. In this case, a rough portion 118 may be formed within the opening C15 of the pixel region PXL1.

The rough portion 118 may be formed along with the opening C15 using one mask, that is, a halftone mask or a slit mask, during the patterning of the third insulating layer 18. The rough portion 118 forms a pattern or series of shapes over the first pixel electrode 114 such that portions of the rough pattern 118 are separated from adjacent portions of the rough pattern 118. Thus, the rough portion may be formed over or cover portions of the first pixel electrode 114, while leaving other portions of the first pixel electrode exposed through the opening C15. Accordingly, a contour along the exposed surfaces of the first pixel electrode 114 and adjacent portions of the rough pattern 118 is non-planar.

Figure 2F:
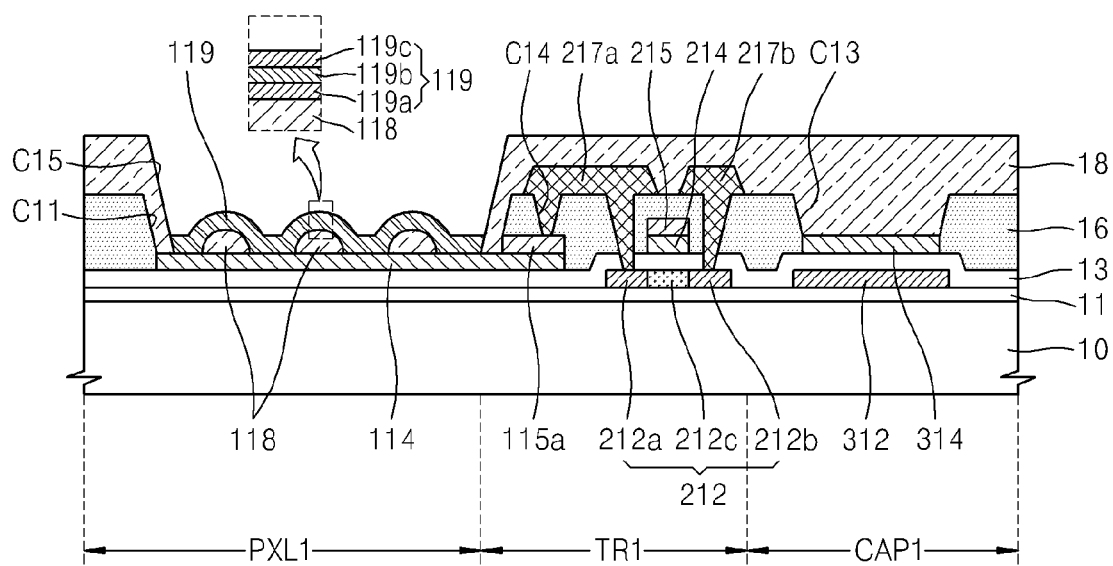

FIG. 2F is a cross-sectional view of a resultant structure obtained by performing a sixth mask process on the OLED display device of FIG. 1.

Referring to FIG. 2F, a transflective metal layer may be formed on the resultant structure obtained using the fifth mask process of FIG. 2E, and patterned so that a second pixel electrode 119 may be formed on the rough portion 118 and the first pixel electrode 114.

The second pixel electrode 119 may include silver (Ag) or an Ag alloy.

Furthermore, the second pixel electrode 119 may have a multi-layered structure as shown in FIG. 2F. For example, the second pixel electrode 119 may include a layer 119c and a layer 119a. The layer 119c may protect the transflective metal layer 119b from etching environments. The layer 119a may reduce adhesion stress between the rough portion 118 and the first pixel electrode 114 and enhance an adhesive strength therebetween. In this case, the two layers 119a and 119c may include a TCO.

The second pixel electrode 119 may have a rough shape obtained by transferring the rough pattern of the rough portion 118. That is, a contour of a surface of the second pixel electrode 119 opposite the first pixel electrode 114 may correspond to the shape or contour formed along the surface of the rough portion 118 and the first pixel electrode 114, such that the contour across the surface of the second pixel electrode 119 is non-planar. The rough pattern may efficiently reduce the occurrence of color shift on side surfaces of the OLED display device 1.

In the method of manufacturing the OLED display device 1 according to the above-described present embodiment, a micro-cavity structure and the rough portion 118 may be formed by minimizing the number of mask processes. Thus, the optical efficiency of the OLED display device 1 may be improved, and the occurrence of color shift on the side surfaces of the OLED display device 1 may be efficiently reduced.

Hereinafter, an OLED display device 2 according to another embodiment of the present invention will be described with reference to FIG. 3.

Figure 3:
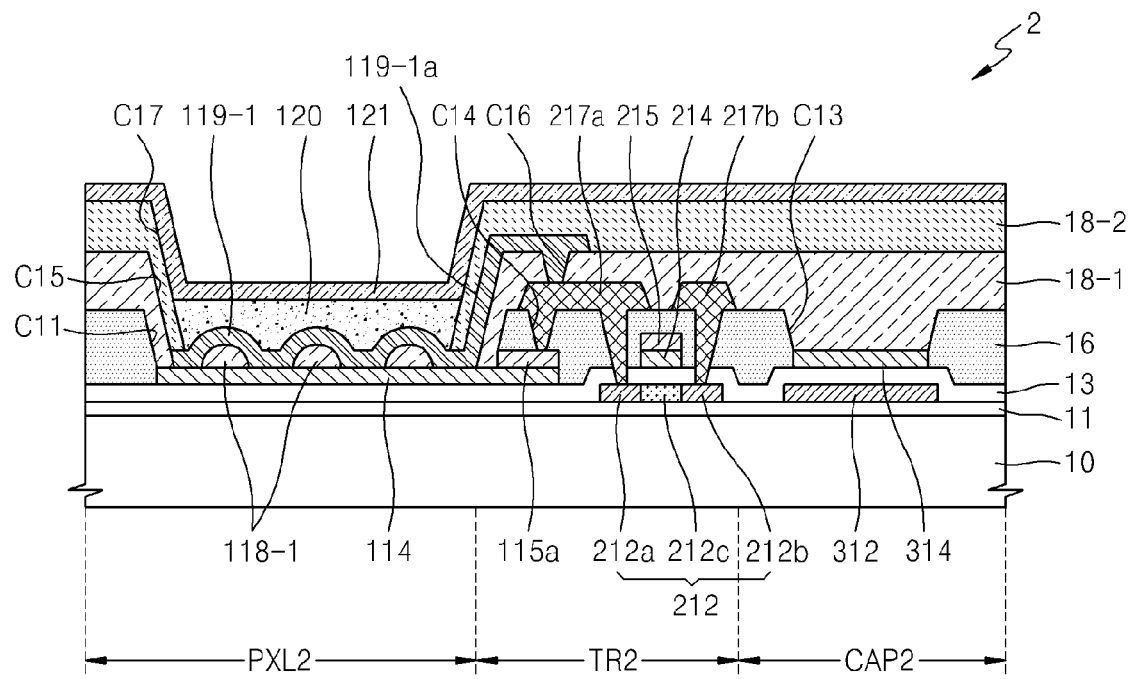
FIG. 3 is a cross-sectional view of an OLED display device according to another embodiment of the present invention.

FIG. 3 is a cross-sectional view of the OLED display device 2 according to another embodiment of the present invention.

Referring to FIG. 3, the OLED display device 2 according to the present embodiment may include a pixel region PXL2, a transistor region TR2, and a capacitor region CAP2. Hereinafter, differences between the OLED display device 1 according to the previous embodiment and the OLED display device 2 according to the present embodiment will chiefly be described, and the same reference numerals refer to the same elements as in the previous embodiment.

A buffer layer 11 may be disposed (e.g., formed) on a substrate 10.

An active layer 212 and a capacitor first electrode 312 may be disposed (e.g., formed) on the buffer layer 11. The active layer 212 may include a source region 212b, a drain region 212a, and a channel layer 212b.

A first insulating layer 13 may be formed on the active layer 212 and the capacitor first electrode 312.

A first pixel electrode 114, a gate electrode 214 and 215, and a capacitor second electrode 314 may be disposed (e.g., formed) on the first insulating layer 13.

A second insulating layer 16 serving as an interlayer insulating layer may be formed on the gate electrode 214 and 215. Openings C11, C14, and C15 may be formed in the second insulating layer 16. The opening C11 may expose a top surface of the first pixel electrode 114, and the opening C14 may expose a first connection 115a formed on an edge of the first pixel electrode 114. Also, the opening C15 may expose a top surface of the capacitor second electrode 314.

A source electrode 217b and a drain electrode 217a may be disposed (e.g., formed) on the second insulating layer 23. The source and drain electrodes 217b and 217a may be formed through the second insulating layer 13 and be respectively coupled to the source and drain regions 212b and 212a of the active layer 212.

A fourth insulating layer 18-1 may be disposed (e.g., formed) on the second insulating layer 16 to cover the source and drain electrodes 217b and 217a, respectively.

The fourth insulating layer 18-1 may include an inorganic insulating layer and/or an organic insulating layer.

Openings C15 and C16 may be formed in the fourth insulating layer 18-1. The opening C15 may expose the top surface of the first pixel electrode 114 in the pixel region PXL2, and the opening C16 may expose a top surface of the drain electrode 217a. Also, the fourth insulating layer 18-1 may be in direct contact with the top surface of the capacitor second electrode 314 through an opening C13 formed in the second insulating layer 16.

A rough portion 118-1 may be formed on the first pixel electrode 114. The rough portion 118-1 may be formed of the same material as that of the fourth insulating layer 18-1. The rough portion 118-1 may efficiently reduce the occurrence of color shift on side surfaces of the OLED display device 2.

A second pixel electrode 119-1 may be formed on the rough portion 118-1 along a rough pattern of the rough portion 118-1. The second pixel electrode 119-2 may include a transflective metal layer. Accordingly, the second pixel electrode 119-1 may form a micro-cavity structure along with an opposing electrode 121 serving as a reflective electrode, thereby improving optical efficiency of the OLED display device 2.

In the present embodiment, an extension 119-1a may extend from the second pixel electrode 119-1 along an etched surface of the opening C15 formed in the second insulating layer 16 in the pixel region PLX2, and be coupled to the drain electrode 217a of a TFT through the opening C16 formed in the fourth insulating layer 18-1.

A fifth insulating layer 18-2 may be formed on the fourth insulating layer 18-1.

An opening C17 may be formed in the fifth insulating layer 18-2 to cover the extension 119-1a of the second pixel electrode 119-1 and expose a top surface of the second pixel electrode 119-1.

An intermediate or middle layer including an organic EML 120 may be disposed (e.g., formed) on the second pixel electrode 119-1, and the opposing electrode 121 may be formed on the organic EML 120 and along an etched surface of the opening C17 and the surface of the fifth insulating layer 18-2 opposite the fourth insulating layer 18-1.

In the above-described OLED display device 2 according to the present embodiment, the first pixel electrode 114 including a transparent conductive material and the second pixel electrode 119-1 including a transflective metal may form the micro-cavity structure along with the opposing electrode 121 serving as the reflective electrode, thereby improving optical efficiency of the OLED display device 2. Furthermore, the rough portion 118-1 formed between the first and second pixel electrodes 114 and 119-1 may efficiently reduce the occurrence of color shift on the side surfaces of the OLED display device 2.

In addition, in the OLED display device 2 according to the present embodiment, the first pixel electrode 114 may be coupled to the drain electrode 217a through the first connection 115a, while the second pixel electrode 119-1 may be coupled to the drain electrode 217a through the extension 119-1a. Accordingly, because driver signals of the TFT may be transmitted to both the first and second pixel electrodes 114 and 119-1, the quality of signals transmitted to the first and second pixel electrodes 114 and 119-1 may be improved.

The above-described OLED display devices and methods of manufacturing the same according to the foregoing embodiments have the following effects.

First, a first pixel electrode may include a transparent conductive material, a second pixel electrode may include a transflective metal, and an opposing electrode may include a reflective electrode so that the first and second pixel electrodes may form a micro-cavity structure along with the opposing electrode to improve optical efficiency of the OLED display devices.

Second, a rough portion may be formed between the first and second pixel electrodes so that the occurrence of color shift on side surfaces of the OLED display devices may be efficiently reduced.

Third, because driver signals of a transistor may be transmitted to both the first and second pixel electrodes, the quality of signals transmitted to the first and second pixel electrodes may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light emitting diode (OLED) display device, the method comprising:
   forming a thin film transistor (TFT) comprising an active layer, a gate electrode, a source electrode, and a drain electrode on a substrate;
   forming a first pixel electrode on the substrate to be coupled to one of the source and drain electrodes;
   forming a contouring material on the first pixel electrode, the contouring material comprising an insulating material;
   forming a second pixel electrode on the contouring material such that the contouring material is between the first pixel electrode and the second pixel electrode and top and bottom surfaces of the second pixel electrode follow a contour of the contouring material and the first pixel electrode, the second pixel electrode being connected to the first pixel electrode between at least two portions of the contouring material and the second pixel electrode comprising a transflective metal layer;

forming an intermediate layer comprising an organic emission layer (EML) on the second pixel electrode; and forming an opposing electrode on the intermediate layer.

2. The method of claim 1, wherein the contouring material and an insulating layer formed between the first pixel electrode and the opposing electrode comprise a same material.

3. The method of claim 2, wherein the insulating layer comprises an organic insulating material.

4. The method of claim 2, wherein the first pixel electrode is at a same layer as the gate electrode, an opening is formed in the insulating layer to expose the first pixel electrode, and the contouring material is in the opening.

5. The method of claim 2, further comprising coupling the second pixel electrode to one of the source electrode and the drain electrode.

6. The method of claim 2, further comprising:

forming a capacitor first electrode in a same layer as the active layer; and forming a capacitor second electrode at a same layer as the first pixel electrode.

* * * * *